United States Patent
Zhang et al.

(10) Patent No.: US 12,288,712 B1
(45) Date of Patent: Apr. 29, 2025

(54) WAFER CALIBRAITON METHOD FOR A WAFER CALIBRATION DEVICE

(71) Applicant: Hito Robotic System Inc., Chino, CA (US)

(72) Inventors: Han Zhang, Nanjing (CN); Rongsheng Lyu, Nanjing (CN); Zhichun Guo, Nanjing (CN); Zuojun Shen, Moraga, CA (US)

( * ) Notice: Subject to any disclaimer, the term of this patent is extended or adjusted under 35 U.S.C. 154(b) by 0 days.

(21) Appl. No.: 19/009,448

(22) Filed: Jan. 3, 2025

(30) Foreign Application Priority Data

Jan. 5, 2024 (CN) .......................... 202410015437.6

(51) Int. Cl.
  *H01L 21/68* (2006.01)
(52) U.S. Cl.
  CPC .................................. *H01L 21/681* (2013.01)
(58) Field of Classification Search
  CPC .................................................... H01L 21/681
  See application file for complete search history.

(56) References Cited

U.S. PATENT DOCUMENTS

| | | | | |
|---|---|---|---|---|
| 2001/0006571 A1* | 7/2001 | Miura | ................ | G01N 21/9501 385/52 |
| 2003/0180127 A1* | 9/2003 | Kuroda | ................ | H01L 21/681 414/217 |
| 2007/0189596 A1* | 8/2007 | Lee | ........................... | G06T 7/33 382/151 |
| 2008/0239277 A1* | 10/2008 | Cramer | ............... | G03F 7/70516 355/77 |
| 2012/0038899 A1* | 2/2012 | Ahn | ......................... | G03F 9/70 355/72 |
| 2013/0044206 A1* | 2/2013 | Liu | ....................... | H01L 21/681 348/87 |
| 2016/0078626 A1* | 3/2016 | Kodama | ............... | H01L 21/681 382/149 |
| 2018/0113386 A1* | 4/2018 | Schipper | ............... | G03F 9/7011 |
| 2021/0057256 A1* | 2/2021 | Bergantz | ........... | H01L 21/67196 |
| 2023/0317490 A1* | 10/2023 | Remillard | ............. | G06T 7/0004 356/399 |
| 2024/0162074 A1* | 5/2024 | Rachinayani | ..... | H01L 21/67259 |

FOREIGN PATENT DOCUMENTS

| | | |
|---|---|---|
| CN | 103021919 A | 4/2013 |
| CN | 103050427 A | 4/2013 |
| CN | 104681475 A | 6/2015 |
| CN | 108493124 A | 5/2018 |
| CN | 212907652 U | 4/2021 |

* cited by examiner

*Primary Examiner* — Kyle O Logan
(74) *Attorney, Agent, or Firm* — Clement Cheng (57) ABSTRACT

A wafer calibrator structure and calibration method is characterized in that the wafer calibrator structure mainly includes a square box base, a p-direction linear driving device, a Z-direction lifting driving device, a θ-direction rotary driving device, and an optical calibration device. The square box base is a box-shaped structure. The base is rectangular, and columns are installed at the four corners of the base. The upper surface of the columns supports a rectangular top plate, and support pins are installed on the top plate.

4 Claims, 9 Drawing Sheets

WAFER CALIBRAITON METHOD FOR A WAFER CALIBRATION DEVICE

TECHNICAL FIELD

This invention relates to the technical field of semiconductor wafer transfer equipment, specifically to a wafer calibrator structure and calibration method.

DISCUSSION OF RELATED ART

Wafer calibration devices known as aligners belong to the technical field of semiconductor wafer transfer equipment. In this field, wafer calibration devices (Aligners), wafer loading systems (Loadports), and wafer transport robots (Robots) together form the core components of the front-end module (EFEM) of semiconductor equipment, significantly impacting semiconductor manufacturing performance. During wafer production, wafers need to be transported from the wafer box to a fixed accurate position. Due to positional deviations of the wafers in the wafer box, there are also deviations when transported to the working position. When the wafer deviates from the center position in the reaction chamber, it can cause discrepancies in the process reaction and even lead to wafer breakage. Manual adjustment of the wafer position is inefficient and affects production rhythm, failing to meet production processing needs. Before processing, wafers usually need to be center-calibrated using a wafer calibration device (Aligner) in the front-end module (EFEM) of semiconductor equipment.

SUMMARY OF THE INVENTION

This invention relates to the technical field of semiconductor wafer transfer equipment, specifically to a wafer calibrator structure and calibration method. The wafer calibrator structure is installed on the front-end module (EFEM) of semiconductor equipment to calibrate the position relationship of the wafer relative to the front-end module (EFEM).

A wafer calibrator structure and calibration method is characterized in that the wafer calibrator structure mainly includes a square box base (1), a ρ-direction linear driving device (2), a Z-direction lifting driving device (3), a θ-direction rotary driving device (4), and an optical calibration device (5). The square box base (1) is a box-shaped structure, the base (1.1) is rectangular, and columns (1.2) are installed at the four corners of the base (1.1). The upper surface of the columns (1.2) supports a rectangular top plate (1.3), and support pins (1.4) are installed on the top plate (1.3).

The ρ-direction linear driving device (2) is installed on the base (1.1) and consists of a screw rod (2.1), bearing seats (2.2), a motor (2.3), and a linear guide rail (2.4). The screw rod (2.1) is axially horizontally placed, with both ends supported on the bearing seats (2.2), which are fixed on the base (1.1). The motor (2.3) is connected to the screw rod (2.1) via a coupling (2.5) and is fixed on a motor seat (2.6) on the base (1.1). A nut seat (2.7) is connected to a transition connecting block (2.8), which is fixed on the right connecting plate (2.9). The right connecting plate (2.9) is fixed on the lower connecting plate (2.10), which is installed on the linear guide rail (2.4) on the base (1.1). The left connecting plate (2.11) and the right connecting plate (2.9) are fixedly connected by a connecting rib (2.12).

The Z-direction lifting driving device (3) is installed on the left and right connecting plates (2.11, 2.9) and consists of a screw rod (3.1), bearing seats (3.2), a motor (3.3), a synchronous belt (3.4), and a linear guide rail (3.5). The screw rod (3.1) is axially vertically placed, with both ends supported on the bearing seats (3.2), which are fixed on the left connecting plate (2.11). The motor (3.3) is fixed on a motor seat (3.6) on a connecting bent plate (3.7) on the right connecting plate (2.9). The motor (3.3) has a synchronous pulley (3.8), and the screw rod (3.1) has a synchronous pulley (3.9), connected by a synchronous belt (3.4). A nut seat (3.10) is connected to a transition connecting block (3.11), which is fixed on a lifting platform (3.12). The lifting platform (3.12) is installed on the linear guide rail (3.5) on the left connecting plate (2.11) and is connected to an auxiliary sliding plate (3.14) on the right connecting plate (2.9) via a beam (3.13).

The θ-direction rotary driving device (4) is installed on the lifting platform (3.12) and consists of a motor (4.1), a synchronous belt (4.2), a rotating shaft (4.3), and a vacuum suction cup (4.4). The motor (4.1) is fixed on a motor seat (4.5) on a connecting bent plate (4.6) on the lifting platform (3.12). A support block (4.7) is fixed on the beam (3.13), with a rolling bearing (4.8) coaxially installed on the support block (4.7) and the beam (3.13). The rotating shaft (4.3) is supported on the rolling bearing (4.8) and has a synchronous pulley (4.9), connected to a synchronous pulley (4.10) on the motor (4.1) by a synchronous belt (4.2). The rotating shaft (4.3) is a hollow shaft, with a rotary joint (4.11) installed at the lower end and a vacuum suction cup (4.4) fixed at the upper end.

The optical calibration device (5) is installed on the base (1.1) and consists of a bracket (5.1), an emitter (5.2), and a receiver (5.3). The bracket (5.1) is fixed on the base (1.1), the emitter (5.2) is fixed on the bracket (5.1), and the receiver (5.3) is fixed on the bracket (5.1) above the emitter (5.2).

Accordingly, the wafer calibrator structure and calibration method are characterized in that the optical calibration device calculates the position deviation of the wafer on the wafer calibrator using a calibration method and corrects the position deviation. The calibration method includes the following steps:

The wafer (6) is placed on the support pins (1.4). The motor (2.3) of the ρ-direction linear driving device (2) drives the screw rod (2.1) to rotate, moving the nut seat (2.7), transition connecting block (2.8), right connecting plate (2.9), and lower connecting plate (2.10) along the ρ-axis direction on the linear guide rail (2.4) to the original position (I).

The motor (3.3) of the Z-direction lifting driving device (3) drives the screw rod (3.1) to rotate via the synchronous belt (3.4), moving the nut seat (3.10), transition connecting block (3.11), lifting platform (3.12), and vacuum suction cup (4.4) on the θ-direction rotary driving device (4) along the Z-axis direction on the linear guide rail (3.5), lifting the wafer (6) from the support pins (1.4) to the working height (III).

The rotary joint (4.11) of the θ-direction rotary driving device (4) is connected to a vacuum pump, creating a negative pressure between the vacuum suction cup (4.4) and the wafer (6), using atmospheric pressure to adsorb the wafer (6) on the vacuum suction cup (4.4).

The wafer (6), creating a negative pressure that uses atmospheric pressure to adsorb the wafer (6) onto the vacuum suction cup (4.4).

The motor (2.3) of the ρ-direction linear driving device (2) drives the screw rod (2.1) to rotate, moving the nut seat (2.7), transition connecting block (2.8), right connecting plate (2.9), and lower connecting plate (2.10) along the ρ-axis direction on the linear guide rail (2.4), positioning the wafer (6) between the emitter (5.2) and receiver (5.3) of the optical calibration device (5) at the detection position (II), ensuring the distance L0 between the center (O) of the vacuum suction cup and the emitter (5.2).

The motor (4.1) of the θ-direction rotary driving device (4) drives the vacuum suction cup (4.4) and the wafer (6) adsorbed on it to rotate along the θ-axis direction, coaxial with the rotating shaft (4.3) and the vacuum suction cup (4.4).

The electrical control system records the rotation angle θi of the motor (4.1) in real-time and the shading length Li of the wafer (6) between the emitter (5.2) and receiver (5.3) at that moment. Using the sampled data [θi, Li] and the calibration algorithm, it calculates the position deviation of the wafer (6) in the polar coordinate system (ρ, θ) of the vacuum suction cup (4.4).

The θ-direction rotary driving device (4) rotates the vacuum suction cup (4.4) by −θj degrees along the θ-axis direction, ensuring the center (P) of the wafer coincides with the ρ-axis of the polar coordinates. The ρ-direction linear driving device (2) drives the Z-direction lifting driving device (3) and the θ-direction rotary driving device (4) from the detection position back to the original position (I).

The rotary joint (4.11) of the θ-direction rotary driving device (4) disconnects from the vacuum pump, releasing the wafer (6) from the vacuum suction cup (4.4). The Z-direction lifting driving device (3) moves the vacuum suction cup (4.4) along the Z-axis direction, detaching it from the wafer (6) and placing the wafer (6) on the support pins (1.4).

The ρ-direction linear driving device (2) moves the Z-direction lifting driving device (3) and the θ-direction rotary driving device (4) along the ρ-axis direction by a distance ρj, aligning the center (O) of the vacuum suction cup with the center (P) of the wafer. The Z-direction lifting driving device (3) moves the vacuum suction cup (4.4) along the Z-axis direction, lifting the wafer (6) from the support pins (1.4).

The ρ-direction linear driving device (2) moves the Z-direction lifting driving device (3) and the θ-direction rotary driving device (4) back to the original position along the ρ-axis direction. The Z-direction lifting driving device (3) moves the vacuum suction cup (4.4) along the Z-axis direction, detaching it from the wafer (6) and placing the wafer (6) on the support pins (1.4), completing the calibration of the wafer (6), with the center (P) of the wafer adjusted to the original position (I) of the wafer calibrator.

The wafer calibrator structure and calibration method are characterized in that the optical calibration device calculates the position deviation of the wafer on the wafer calibrator using a calibration algorithm, which is fitted by the least squares method as follows:

$$u_i = (L_0 + L_i)\cos(\theta_i) - \sum (L_0 + L_i)\cos(\theta_i)/N$$

$$v_i = -(L_0 + L_i)\sin(\theta_i) + \sum (L_0 + L_i)\sin(\theta_i)/N$$

$$x_c = \frac{\sum u_i^2 v_i \sum u_i v_i - \sum u_i^3 \sum v_i^2 - \sum u_i v_i^2 \sum v_i^2 + \sum v_i^3 \sum u_i v_i}{2\left[\left(\sum u_i v_i\right)^2 - \sum u_i^2 \sum v_i^2\right]} + \frac{\sum (L_0 + L_i)\cos(\theta_i)/N}$$

$$y_c = \frac{\sum v_i^2 u_i \sum u_i v_i - \sum v_i^3 \sum u_i^2 - \sum u_i^2 v_i \sum u_i^2 + \sum u_i^3 \sum u_i v_i}{2\left[\left(\sum u_i v_i\right)^2 - \sum u_i^2 \sum v_i^2\right]} - \sum (L_0 + L_i)\sin(\theta_i)/N$$

$$\rho_j = \sqrt{x_c^2 + y_c^2}$$

$$\theta_j = \begin{cases} \arctan\left(\dfrac{x_c}{\rho_j}\right), & x_c \geq 0 \\ \arctan\left(\dfrac{x_c}{\rho_j}\right) + \pi, & x_c < 0 \end{cases}$$

In correspondence with the technical problems to be solved and the technical solutions, described the effects that this invention can achieve (including social, economic, and technical effects, preferably with specific data) in a specific and realistic manner. Scientific analysis and experimental results are the most convincing evidence.

The beneficial effects of this invention are:

1. This invention provides a wafer calibrator structure and calibration method. The ρ-direction linear driving device consists of a screw rod, bearing seats, a motor, and a linear guide rail. The screw rod is axially horizontally placed, with both ends supported on the bearing seats. The motor is connected to the screw rod via a coupling, and the nut seat is connected to a transition connecting block, which is fixed on the right connecting plate. This drives the Z-direction lifting driving device and the θ-direction rotary driving device to move horizontally along the ρ-axis direction.

2. The Z-direction lifting driving device consists of a screw rod, bearing seats, a motor, a synchronous belt, and a linear guide rail. The screw rod is axially vertically placed, with both ends supported on the bearing seats, which are fixed on the left connecting plate. The motor has a synchronous pulley, and the screw rod has a synchronous pulley. Through synchronous belt transmission, the nut seat is connected to a transition connecting block, which is fixed on the lifting platform, driving the θ-direction rotary driving device to move vertically.

3. The θ-direction rotary driving device is installed on the lifting platform and consists of a motor, a synchronous belt, a rotating shaft, and a vacuum suction cup. The motor is fixed on a motor seat, which is fixed on a connecting bent plate on the lifting platform. A support block is fixed on the beam, with a rolling bearing coaxially installed on the support block and the beam. The rotating shaft is supported on the rolling bearing and has a synchronous pulley. The motor also has a synchronous pulley. Through synchronous belt transmission, the rotating shaft, which is a hollow shaft, has a rotary joint installed at the lower end and a vacuum suction cup fixed at the upper end for adsorbing and rotating the wafer.

4. The optical calibration device is installed on the base and consists of a bracket, an emitter, and a receiver. The bracket is fixed on the base, the emitter is fixed on the bracket, and the receiver is fixed on the bracket above the emitter. The emitter and receiver are used to detect the shading amount of sampling points during wafer rotation and calculate the distance from the wafer edge to the center of the vacuum suction cup.

5. By sampling the rotation angle of the vacuum suction cup and the shading amount of the wafer, the least squares method is used to fit the polar coordinate deviation of the wafer center relative to the vacuum suction cup center.
6. Through the movement of the ρ-direction linear driving device, the Z-direction lifting driving device, and the θ-direction rotary driving device, using the signals collected by the optical calibration device and the position deviation calibration algorithm of the wafer on the wafer calibrator, the position relationship of the wafer relative to the front-end module (EFEM) of the equipment is corrected and adjusted.

These drawings should clearly illustrate the inventive points. Various drawing methods can be used for this purpose. Components and structures are uniformly numbered and named.

1: Square box base
1.1: Base
1.2: Column
1.3: Top plate
1.4: Support pin
2: ρ-direction linear driving device
2.1: Screw rod
2.2: Bearing seat
2.3: Motor
2.4: Linear guide rail
2.5: Coupling
2.6: Motor seat
2.7: Nut seat
2.8: Transition connecting block
2.9: Right connecting plate
2.10: Lower connecting plate
2.11: Left connecting plate
2.12: Connecting rib
3: Z-direction lifting driving device
3.1: Screw rod
3.2: Bearing seat
3.3: Motor
3.4: Synchronous belt
3.5: Linear guide rail
3.6: Motor seat
3.7: Connecting bent plate
3.8: Synchronous pulley
3.9: Synchronous pulley
3.10: Nut seat
3.11: Transition connecting block
3.12: Lifting platform
3.13: Beam
3.14: Auxiliary sliding plate
3.15: Linear guide rail
4: θ-direction rotary driving device
4.1: Motor
4.2: Synchronous belt
4.3: Rotating shaft
4.4: Vacuum suction cup
4.5: Motor seat
4.6: Connecting bent plate
4.7: Support block
4.8: Rolling bearing
4.9: Synchronous pulley
4.10: Synchronous pulley
4.11: Rotary joint
5: Optical calibration device
5.1: Bracket
5.2: Emitter
5.3: Receiver
6: Wafer
I: Original position
II: Detection position
III: Working height
O: Center of the vacuum suction cup
P: Center of the wafer

DETAILED DESCRIPTION OF THE EMBODIMENTS

Figure 1:
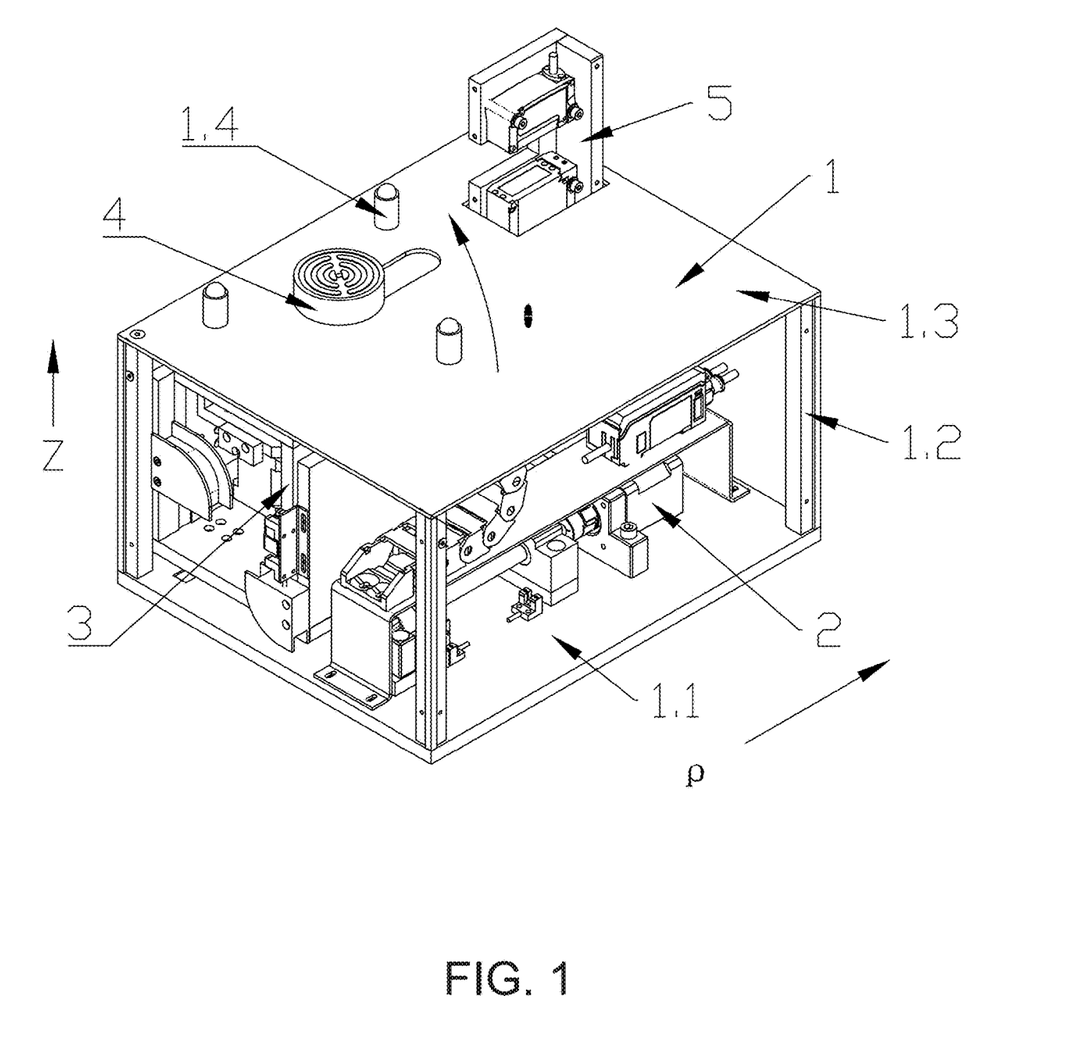
FIG. 1 is an isometric view of the wafer calibrator structure of this invention.

As shown in FIG. 1, the wafer calibrator structure of this invention mainly includes a square box base (1), a ρ-direction linear driving device (2), a Z-direction lifting driving device (3), a θ-direction rotary driving device (4), and an optical calibration device (5).

As seen in FIG. 1, the square box base (1) is a box-shaped structure. The base (1.1) is rectangular, with columns (1.2) installed at the four corners. The upper surface of the columns (1.2) supports a rectangular top plate (1.3), on which support pins (1.4) are installed.

Figure 2:
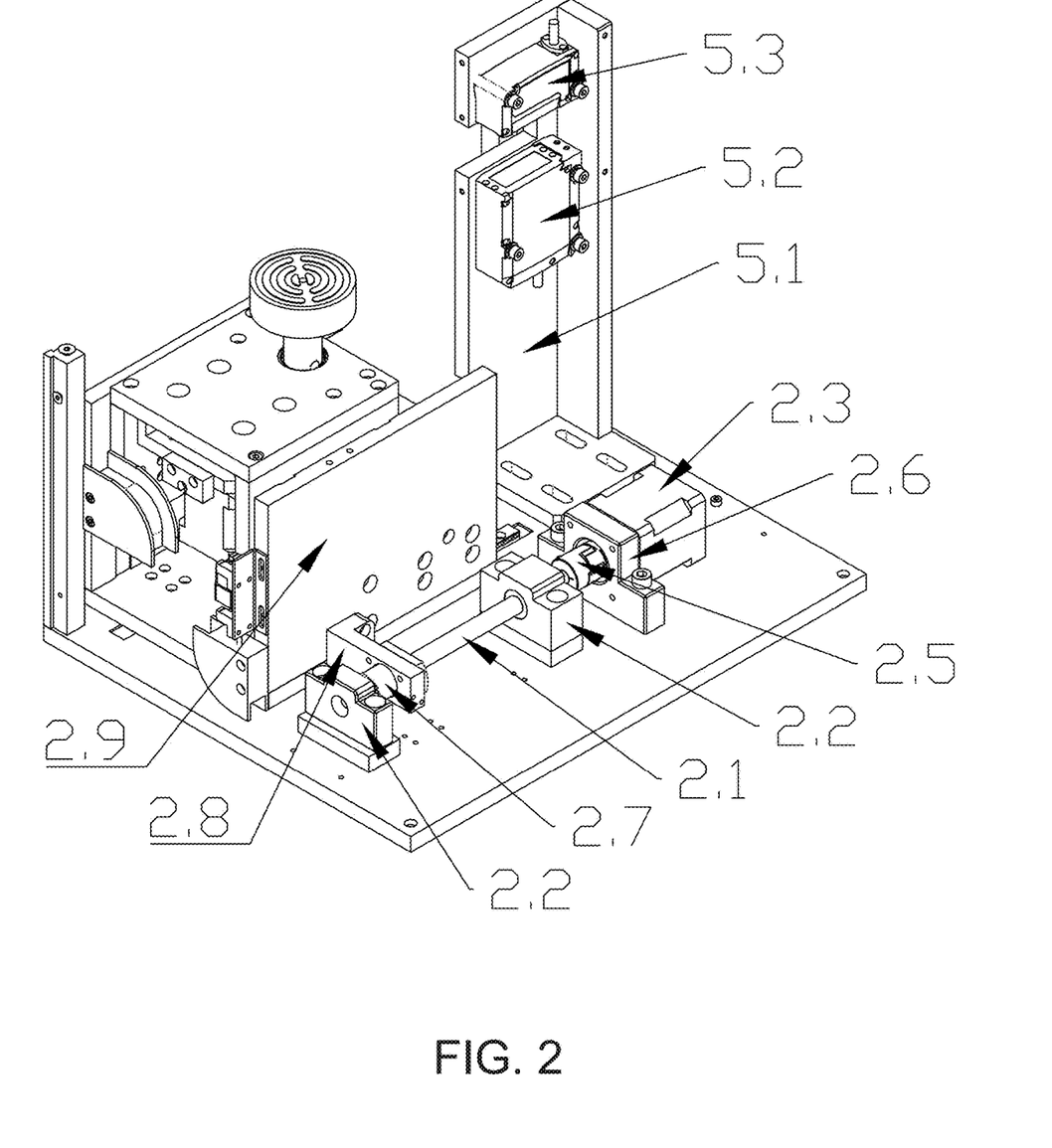
FIG. 2 is a structural diagram of the screw rod transmission mechanism of the ρ-direction linear driving device and the optical calibration device.
Figure 3:
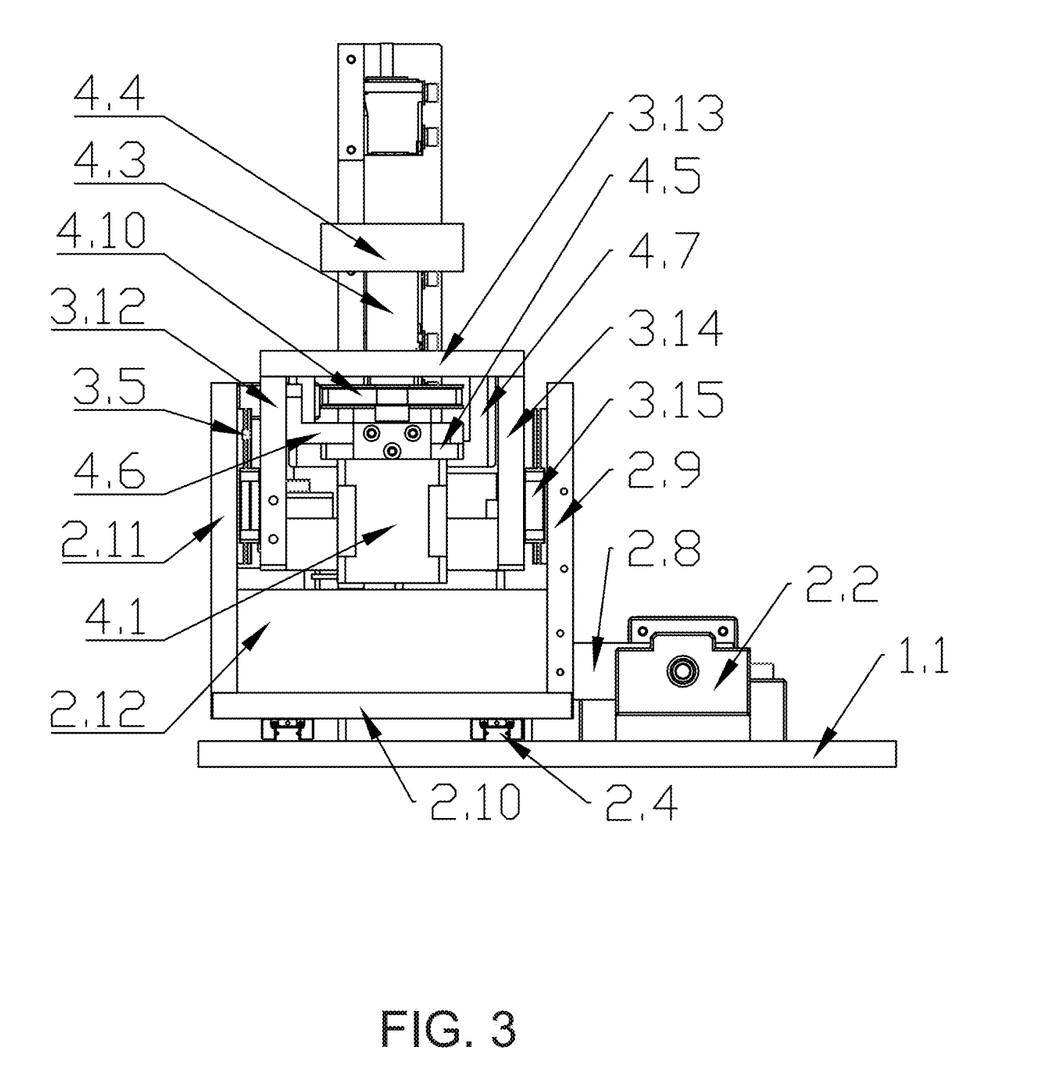
FIG. 3 is a front view of the ρ-direction linear driving device.
Figure 4:
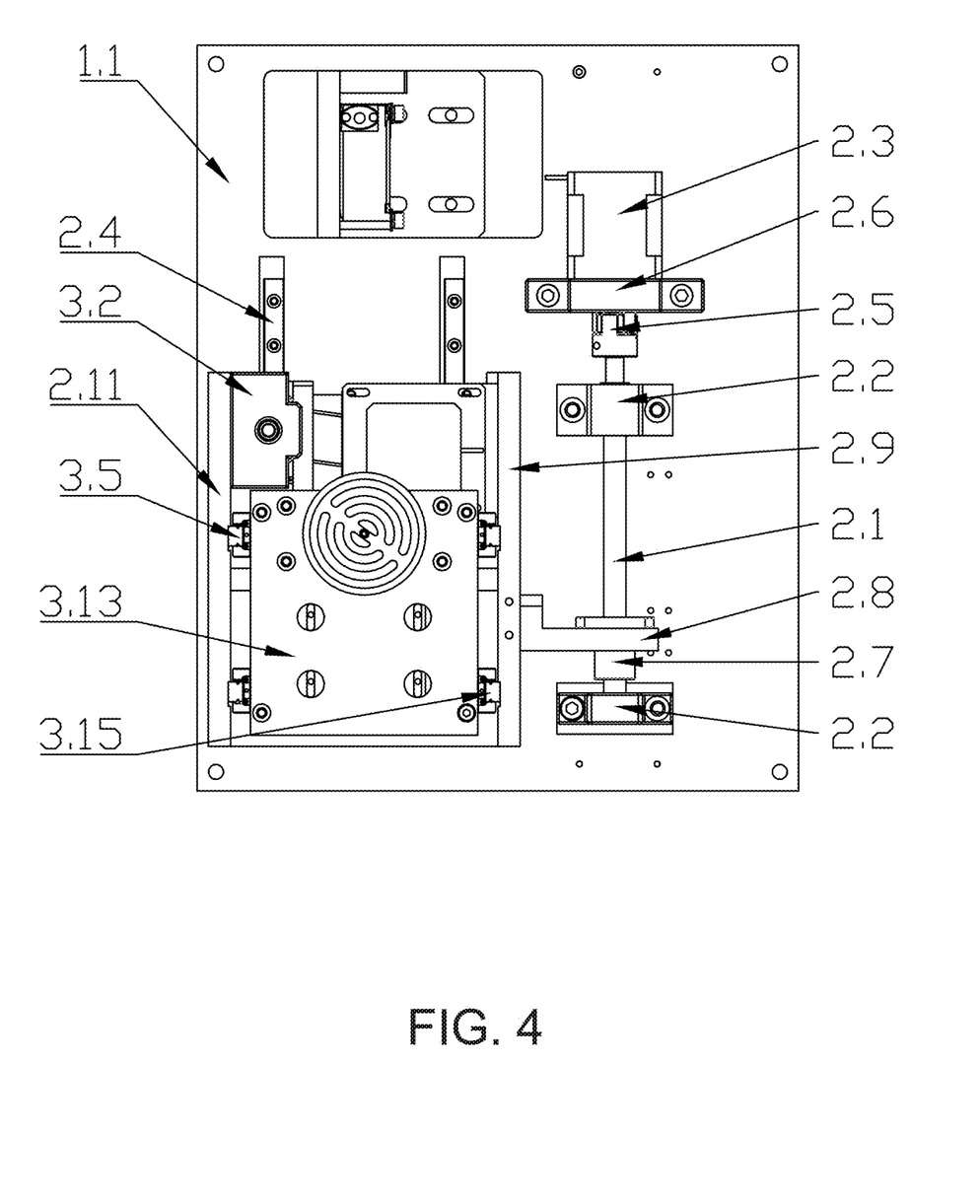
FIG. 4 is a top view of the ρ-direction linear driving device.

FIGS. 2, 3, and 4: The ρ-direction linear driving device (2) is installed on the base (1.1) and consists of a screw rod (2.1), bearing seats (2.2), a motor (2.3), and a linear guide rail (2.4). The screw rod (2.1) is axially horizontally placed, with both ends supported on the bearing seats (2.2), which are fixed on the base (1.1). The motor (2.3) is connected to the screw rod (2.1) via a coupling (2.5) and is fixed on a motor seat (2.6) on the base (1.1). The nut seat (2.7) is connected to a transition connecting block (2.8), which is fixed on the right connecting plate (2.9). The right connecting plate (2.9) is fixed on the lower connecting plate (2.10), which is installed on the linear guide rail (2.4) on the base (1.1). The left connecting plate (2.11) and the right connecting plate (2.9) are fixedly connected by a connecting rib (2.12).

Figure 5:
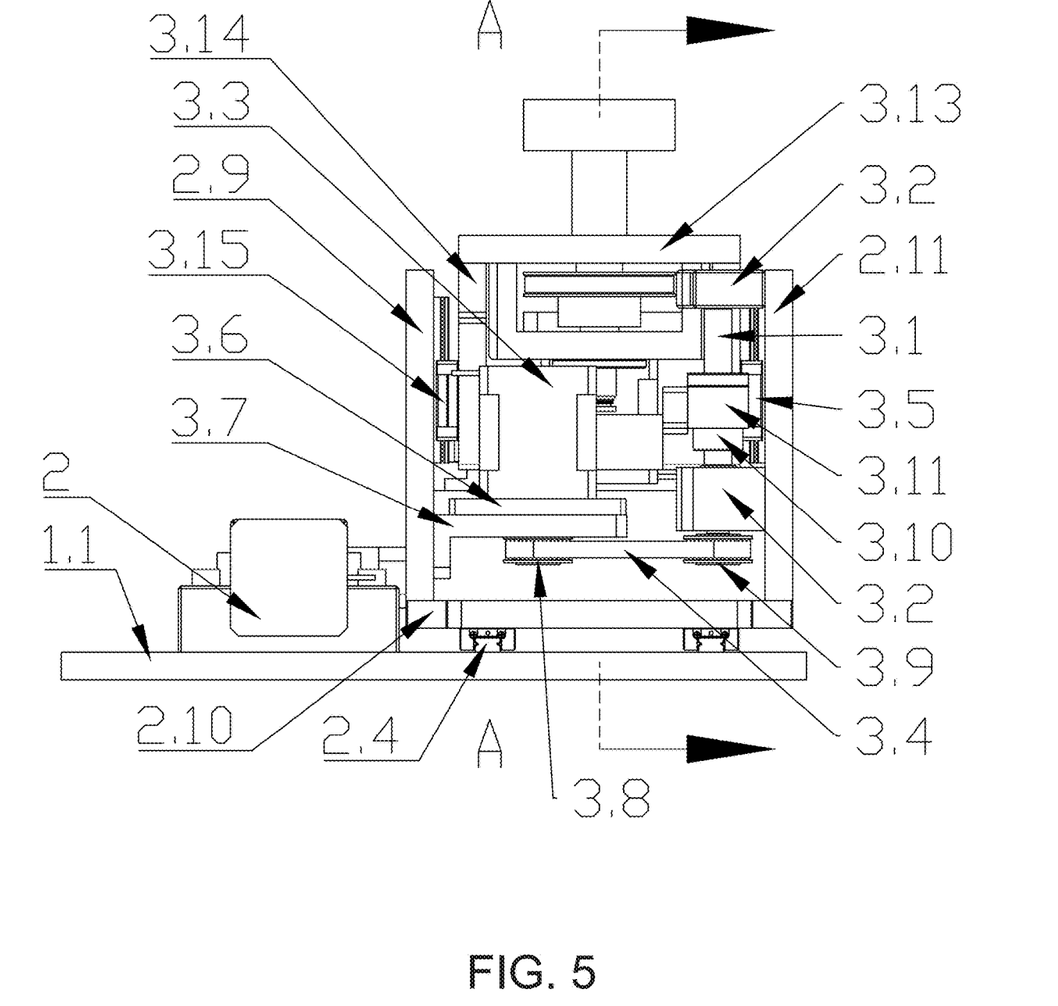
FIG. 5 is a rear view of the Z-direction lifting driving device.

FIG. 5: The Z-direction lifting driving device (3) is installed on the left and right connecting plates (2.11, 2.9) and consists of a screw rod (3.1), bearing seats (3.2), a motor (3.3), a synchronous belt (3.4), and a linear guide rail (3.5). The screw rod (3.1) is axially vertically placed, with both ends supported on the bearing seats (3.2), which are fixed on the left connecting plate (2.11). The motor (3.3) is fixed on a motor seat (3.6) on a connecting bent plate (3.7) on the right connecting plate (2.9). The motor (3.3) has a synchronous pulley (3.8), and the screw rod (3.1) has a synchronous pulley (3.9), connected by a synchronous belt (3.4). The nut seat (3.10) is connected to a transition connecting block (3.11), which is fixed on a lifting platform (3.12). The lifting platform (3.12) is installed on the linear guide rail (3.5) on the left connecting plate (2.11) and is connected to an auxiliary sliding plate (3.14) on the right connecting plate (2.9) via a beam (3.13).

Figure 6:
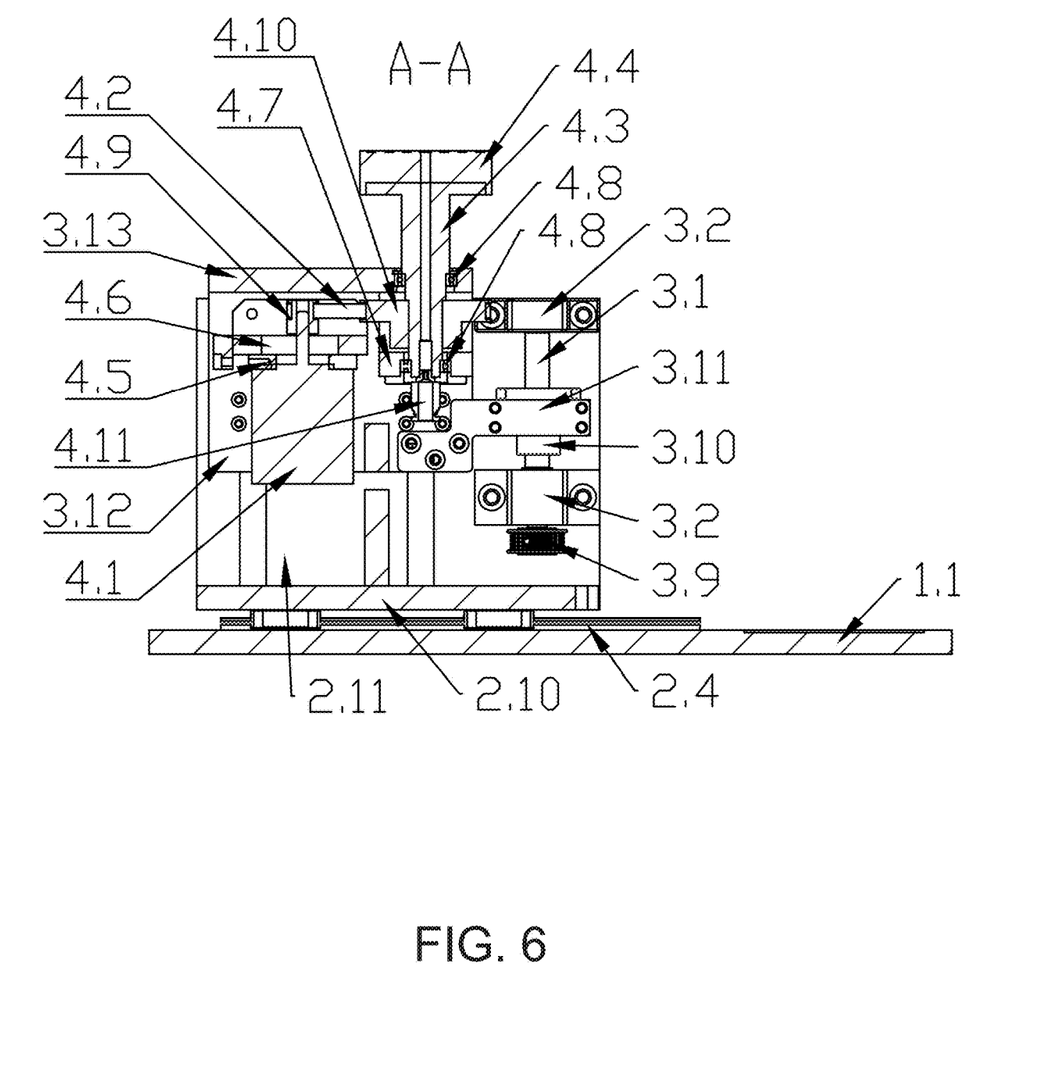
FIG. 6 is a sectional view along line A-A of FIG. 5.

FIG. 6: The θ-direction rotary driving device (4) is installed on the lifting platform (3.12) and consists of a motor (4.1), a synchronous belt (4.2), a rotating shaft (4.3), and a vacuum suction cup (4.4). The motor (4.1) is fixed on a motor seat (4.5) on a connecting bent plate (4.6) on the lifting platform (3.12). A support block (4.7) is fixed on the beam (3.13), with a rolling bearing (4.8) coaxially installed on the support block (4.7) and the beam (3.13). The rotating shaft (4.3) is supported on the rolling bearing (4.8) and has a synchronous pulley (4.9), connected to a synchronous pulley (4.10) on the motor (4.1) by a synchronous belt (4.2). The rotating shaft (4.3) is a hollow shaft, with a rotary joint (4.11) installed at the lower end and a vacuum suction cup (4.4) fixed at the upper end.

FIG. 1: The optical calibration device (5) is installed on the base (1.1) and consists of a bracket (5.1), an emitter (5.2), and a receiver (5.3). The bracket (5.1) is fixed on the base (1.1), the emitter (5.2) is fixed on the bracket (5.1), and the receiver (5.3) is fixed on the bracket (5.1) above the emitter (5.2).

Figure 7:
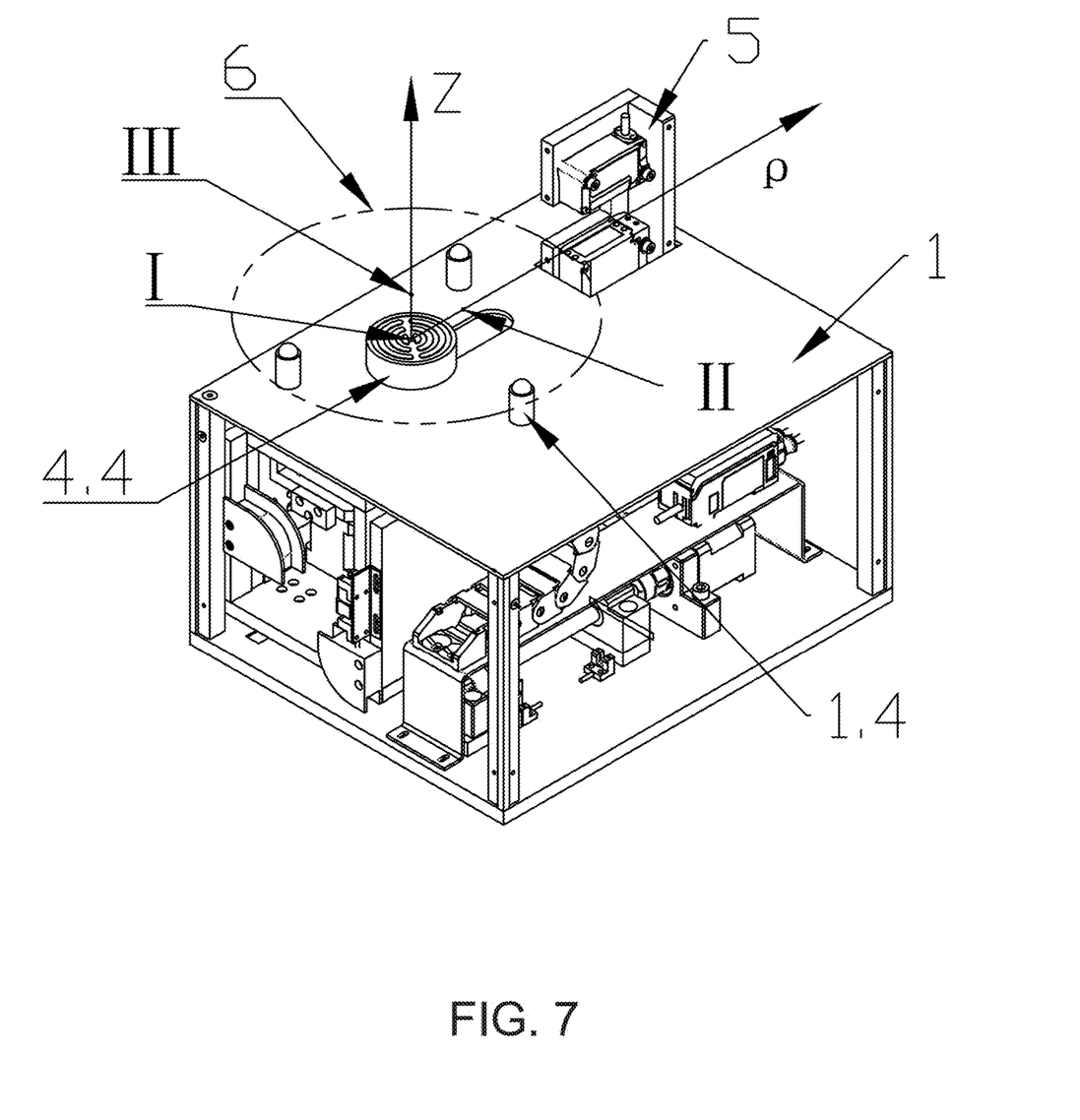
FIG. 7 is a schematic diagram of the coordinate positions for the calibration method of the wafer calibrator.

As shown in FIG. 7, when calibrating the wafer, the wafer (6) is first placed on the support pins (1.4). The motor (2.3) of the ρ-direction linear driving device (2) drives the screw rod (2.1) to rotate, moving the nut seat (2.7), transition connecting block (2.8), right connecting plate (2.9), and lower connecting plate (2.10) along the ρ-axis direction on the linear guide rail (2.4) to the original position (I).

The motor (3.3) of the Z-direction lifting driving device (3) drives the screw rod (3.1) to rotate via the synchronous belt (3.4), moving the nut seat (3.10), transition connecting block (3.11), lifting platform (3.12), and vacuum suction cup (4.4) on the θ-direction rotary driving device (4) along the Z-axis direction on the linear guide rail (3.5), lifting the wafer (6) from the support pins (1.4) to the working height (III).

The rotary joint (4.11) of the θ-direction rotary driving device (4) is connected to a vacuum pump, creating a negative pressure between the vacuum suction cup (4.4) and the wafer (6), using atmospheric pressure to adsorb the wafer (6) onto the vacuum suction cup (4.4).

Figure 9:
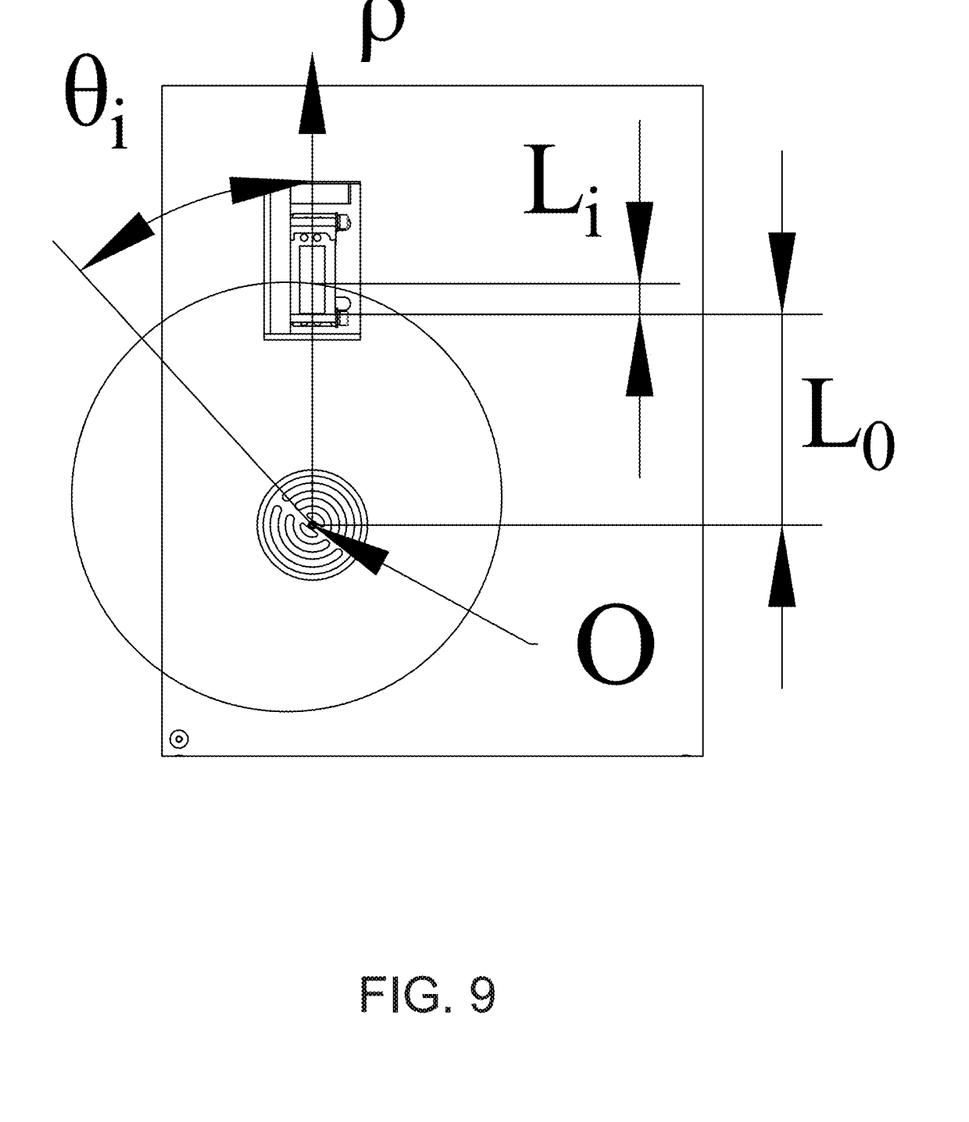
FIG. 9 is a schematic diagram of the electrical control system sampling data.

As shown in FIG. 9, the motor (2.3) of the ρ-direction linear driving device (2) drives the screw rod (2.1) to rotate, moving the nut seat (2.7), transition connecting block (2.8), right connecting plate (2.9), and lower connecting plate (2.10) along the ρ-axis direction on the linear guide rail (2.4), positioning the wafer (6) between the emitter (5.2) and receiver (5.3) of the optical calibration device (5) at the detection position (II), ensuring the distance L0 between the center (O) of the vacuum suction cup and the emitter (5.2).

The motor (4.1) of the e-direction rotary driving device (4) drives the vacuum suction cup (4.4) and the wafer (6) adsorbed on it to rotate along the θ-axis direction, coaxial with the rotating shaft (4.3) and the vacuum suction cup (4.4).

Figure 8:
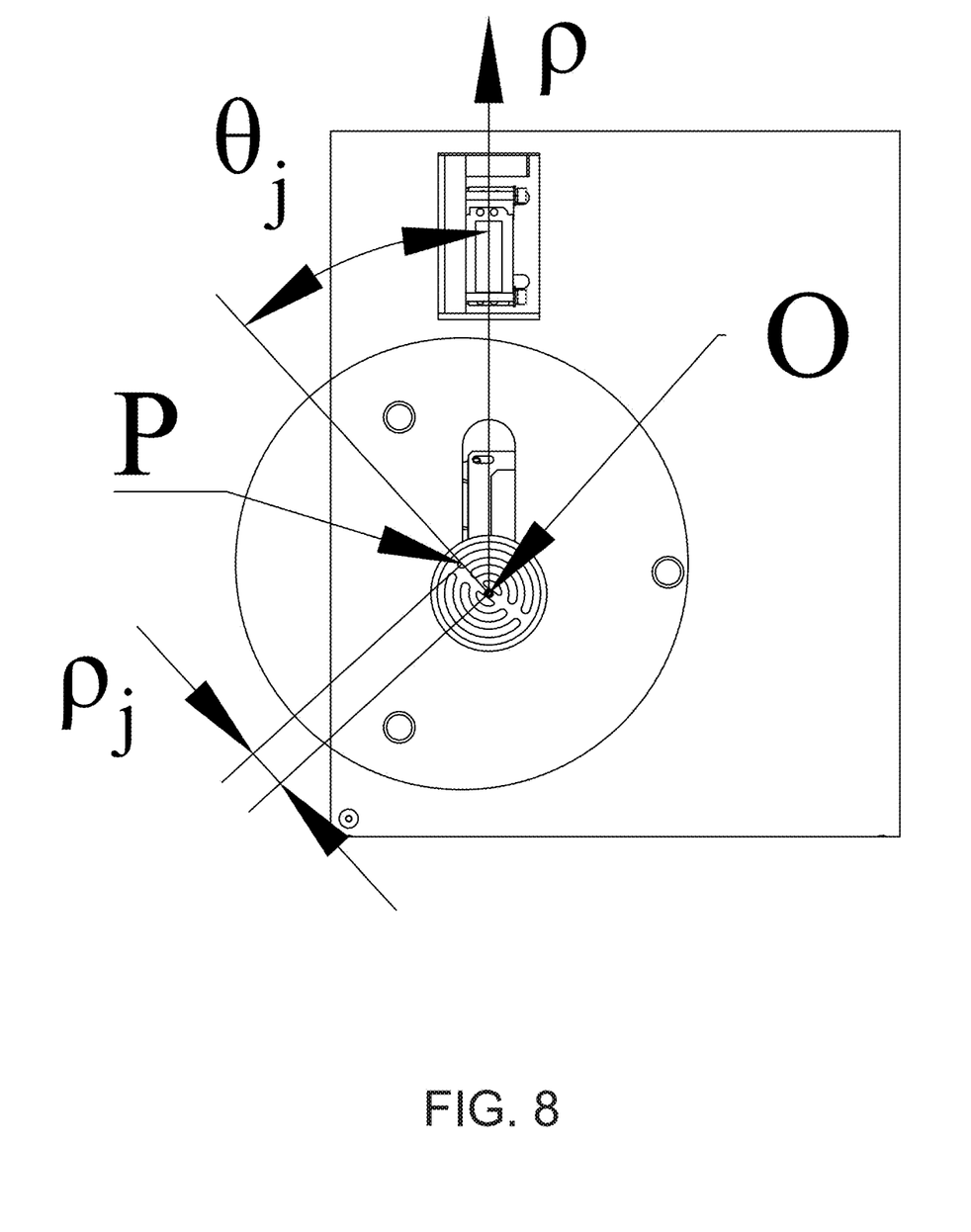
FIG. 8 is the polar coordinate system of the vacuum suction cup and the wafer.

As shown in FIG. 8, the electrical control system records the rotation angle θi of the motor (4.1) in real-time and the shading length Li of the wafer (6) between the emitter (5.2) and receiver (5.3) at that moment. Using the sampled data [θi, Li] and the calibration algorithm, it calculates the position deviation of the wafer (6) in the polar coordinate system (ρ, θ) of the vacuum suction cup (4.4).

The θ-direction rotary driving device (4) rotates the vacuum suction cup (4.4) by −θj degrees along the θ-axis direction, ensuring the center (P) of the wafer coincides with the ρ-axis of the polar coordinates. The ρ-direction linear driving device (2) drives the Z-direction lifting driving device (3) and the θ-direction rotary driving device (4) from the detection position back to the original position (I).

The rotary joint (4.11) of the θ-direction rotary driving device (4) disconnects from the vacuum pump, releasing the wafer (6) from the vacuum suction cup (4.4). The Z-direction lifting driving device (3) moves the vacuum suction cup (4.4) along the Z-axis direction, detaching it from the wafer (6) and placing the wafer (6) on the support pins (1.4).

The ρ-direction linear driving device (2) moves the Z-direction lifting driving device (3) and the θ-direction rotary driving device (4) along the ρ-axis direction by a distance ρj, aligning the center (O) of the vacuum suction cup with the center (P) of the wafer. The Z-direction lifting driving device (3) moves the vacuum suction cup (4.4) along the Z-axis direction, lifting the wafer (6) from the support pins (1.4).

The ρ-direction linear driving device (2) moves the Z-direction lifting driving device (3) and the θ-direction rotary driving device (4) back to the original position along the ρ-axis direction. The Z-direction lifting driving device (3) moves the vacuum suction cup (4.4) along the Z-axis direction, detaching it from the wafer (6) and placing the wafer (6) on the support pins (1.4), completing the calibration of the wafer (6), with the center (P) of the wafer adjusted to the original position (I) of the wafer calibrator.

The optical calibration device calculates the position deviation of the wafer on the wafer calibrator using a calibration algorithm, which is fitted by the least squares method.

The sampled data of the rotation angle of the vacuum suction cup (4.4) during wafer rotation and the shading length Li between the emitter (5.2) and receiver (5.3) are [θi, Li]. The distance between the center (O) of the vacuum suction cup and the emitter (5.2) is L0. The sampling coordinates of the actual sampling points on the wafer edge relative to the polar coordinates (ρ, θ) of the vacuum suction cup (4.4) are (Li+L0, −θi), with the corresponding Cartesian coordinates being [(Li+L0) cos σi, −(Li+L0)sin θi].

Fits the equation of the circle where the actual sampling point at the edge of the wafer is located by least squares $$(X-x_c)^2+(Y-y_c)^2=R^2$$

In order to ensure that the sum of squares of the distance from the sampling point to the fitted circle is minimized, i.e.:

$$\Sigma[\sqrt{(x_i-x_c)^2+(y_i-y_c)^2}-R]^2$$

The equivalence is the minimum square of the square of the distance from the sampling point to the fitted circle and the square difference of the radius:

$$f=\Sigma[(x_i-x_c)^2+(y_i-y_c)^2-R^2]^2$$

Guarantee f minimum, then:

$$\frac{\partial f}{\partial x_c}=0$$

$$\frac{\partial f}{\partial y_c}=0$$

$$\frac{\partial f}{\partial R}=0$$

Solution:

$$u_i = (L_0 + L_i)\cos(\theta_i) - \sum(L_0 + L_i)\cos(\theta_i)/N$$

$$v_i = -(L_0 + L_i)\sin(\theta_i) + \sum(L_0 + L_i)\sin(\theta_i)/N$$

$$x_c = \frac{\sum u_i^2 v_i \sum u_i v_i - \sum u_i^3 \sum v_i^2 - \sum u_i v_i^2 \sum v_i^2 + \sum v_i^3 \sum u_i v_i}{2\left[\left(\sum u_i v_i\right)^2 - \sum u_i^2 \sum v_i^2\right]} +$$

$$\sum(L_0 + L_i)\cos(\theta_i)/N$$

$$y_c = \frac{\sum v_i^2 u_i \sum u_i v_i - \sum v_i^3 \sum u_i^2 - \sum u_i^2 v_i \sum u_i^2 + \sum u_i^3 \sum u_i v_i}{2\left[\left(\sum u_i v_i\right)^2 - \sum u_i^2 \sum v_i^2\right]} -$$

$$\sum(L_0 + L_i)\sin(\theta_i)/N$$

$$\rho_j = \sqrt{x_c^2 + y_c^2}$$

$$\theta_j = \begin{cases} \arctan\left(\frac{x_c}{\rho_j}\right), & x_c \geq 0 \\ \arctan\left(\frac{x_c}{\rho_j}\right) + \pi, & x_c < 0 \end{cases}$$

7. Key Points of Novelty

The invention relates to the device and method. The structure and calibration method of the wafer calibrator are characterized in that: the structure of the wafer calibrator mainly comprises a square box matrix (1), a ρ-direction linear driving device (2), a Z-direction lifting driving device (3), a theta direction rotary driving device (4), and an optical calibration device (5), wherein:

The base body of the square box (1) is a square box-like structure, the base (1.1) is a rectangular structure, the four corners of the base (1.1) are provided with columns (1.2), the upper surface of the column (1.2) is supported with a rectangular upper top plate (1.3), and the upper top plate (1.3) is provided with a supporting pin (1.4).

The ρ-direction linear driving device (2) is installed on the base (1.1), and the ρ-direction linear driving device (2) is composed of a lead screw (2.1), a bearing seat (2.2), a motor (2.3), Linear guide rail (2.4) is composed, the lead screw (2.1) is placed axially horizontally, the two ends of the lead screw (2.1) are supported on the bearing seat (2.2) respectively, the bearing seat (2.2) is fixed on the base (1.1), the motor (2.3) is connected with the lead screw (2.1) through the coupling (2.5), the motor (2.3) is fixed on the motor base (2.6), the motor base (2.6) is fixed on the base (1.1), the wire mother seat (2.7) is connected with the transition connecting block (2.8), the transition connection (2.8) block is fixed on the right side connecting plate (2.9), and the right connecting plate (2.9) is fixed on the lower connecting plate (2.10). Upper, lower connecting plate (2.10) is fixed with left side connecting plate (2.11), lower connecting plate (2.10) is arranged on linear guide rail (2.4), linear guide rail (2.4) is fixed on base (1.1), and left side connecting plate (2.11) and right side connecting plate (2.9) are fixedly connected by connecting rib (2.12).

Z-direction lifting drive device (3) is arranged on left side connecting plate (2.11) and right side connecting plate (2.9), and Z-direction lifting drive device (3) is made up of leading screw (3.1), bearing seat (3.2), motor (3.3), synchronous belt (3.4), Linear guide rail (3.5) is composed, the lead screw (3.1) is axially vertically placed, the two ends of the lead screw (3.1) are supported on the bearing seat (3.2) respectively, the bearing seat (3.2) is fixed on the left side connecting plate (2.11), the motor (3.3) is fixed on the motor base (3.6), the motor base (3.6) is fixed on the connecting bend plate (3.7), the connecting bend plate (3.7) is fixed on the right side connecting plate (2.9), the motor (3.3) has a synchronous pulley (3.8), the leading screw (3.1) has a synchronous pulley (3.9), and there is a synchronous belt (3.4) between the synchronous pulley (3.8) and the synchronous pulley (3.9), wire mother (3.10) is connected with transition connecting block (3.11), transition connection (3.11) block is fixed on lifting platform (3.12), lifting platform (3.12) is installed on linear guide rail (3.5), linear guide rail (3.5) is fixed on left side connecting plate (2.11).

The lifting platform (3.12) is connected to an auxiliary sliding plate (3.14) via a beam (3.13). The auxiliary sliding plate (3.14) is installed on a linear guide rail (3.15), which is fixed on the right connecting plate (2.9).

The θ-direction rotary driving device (4) is installed on the lifting platform (3.12) and consists of a motor (4.1), a synchronous belt (4.2), a rotating shaft (4.3), and a vacuum suction cup (4.4). The motor (4.1) is fixed on a motor seat (4.5), which is fixed on a connecting bent plate (4.6) on the lifting platform (3.12). A support block (4.7) is fixed on the beam (3.13), with a rolling bearing (4.8) coaxially installed on the support block (4.7) and the beam (3.13). The rotating shaft (4.3) is supported on the rolling bearing (4.8) and has a synchronous pulley (4.9), connected to a synchronous pulley (4.10) on the motor (4.1) by a synchronous belt (4.2). The rotating shaft (4.3) is a hollow shaft, with a rotary joint (4.11) installed at the lower end and a vacuum suction cup (4.4) fixed at the upper end.

The optical calibration device (5) is installed on the base (1.1) and consists of a bracket (5.1), an emitter (5.2), and a receiver (5.3). The bracket (5.1) is fixed on the base (1.1), the emitter (5.2) is fixed on the bracket (5.1), and the receiver (5.3) is fixed on the bracket (5.1) above the emitter (5.2).

The wafer calibrator structure and calibration method are characterized in that the optical calibration device calculates the position deviation of the wafer on the wafer calibrator using a calibration method and corrects the position deviation. The calibration method includes the following steps:

The wafer (6) is placed on the support pins (1.4). The motor (2.3) of the p-direction linear driving device (2) drives the screw rod (2.1) to rotate, moving the nut seat (2.7), transition connecting block (2.8), right connecting plate (2.9), and lower connecting plate (2.10) along the ρ-axis direction on the linear guide rail (2.4) to the original position (I).

The motor (3.3) of the Z-direction lifting driving device (3) drives the screw rod (3.1) to rotate via the synchronous belt (3.4), moving the nut seat (3.10), transition connecting block (3.11), lifting platform (3.12), and vacuum suction cup (4.4) on the θ-direction rotary driving device (4) along the Z-axis direction on the linear guide rail (3.5), lifting the wafer (6) from the support pins (1.4) to the working height (III).

The rotary joint (4.11) of the θ-direction rotary driving device (4) is connected to a vacuum pump, creating a negative pressure between the vacuum suction cup (4.4) and the wafer (6), using atmospheric pressure to adsorb the wafer (6) onto the vacuum suction cup (4.4).

The motor (2.3) of the ρ-direction linear driving device (2) drives the screw rod (2.1) to rotate, moving the nut seat (2.7), transition connecting block (2.8), right connecting plate (2.9), and lower connecting plate (2.10) along the ρ-axis direction on the linear guide rail (2.4), positioning the wafer (6) between the emitter (5.2) and receiver (5.3) of the optical calibration device (5) at the detection position (II), ensuring the distance L0 between the center (O) of the vacuum suction cup and the emitter (5.2).

The motor (4.1) of the θ-direction rotary driving device (4) drives the vacuum suction cup (4.4) and the wafer (6) adsorbed on it to rotate along the θ-axis direction, coaxial with the rotating shaft (4.3) and the vacuum suction cup (4.4).

The electrical control system records the rotation angle θi of the motor (4.1) in real-time and the shading length Li of the wafer (6) between the emitter (5.2) and receiver (5.3) at that moment. Using the sampled data [θi, Li] and the calibration algorithm, it calculates the position deviation of the wafer (6) in the polar coordinate system (ρ, θ) of the vacuum suction cup (4.4).

The θ-direction rotary driving device (4) rotates the vacuum suction cup (4.4) by −θj degrees along the θ-axis direction, ensuring the center (P) of the wafer coincides with the ρ-axis of the polar coordinates. The ρ-direction linear driving device (2) drives the Z-direction lifting driving device (3) and the θ-direction rotary driving device (4) from the detection position back to the original position (I).

The rotary joint (4.11) of the θ-direction rotary driving device (4) disconnects from the vacuum pump, releasing the wafer (6) from the vacuum suction cup (4.4). The Z-direction lifting driving device (3) moves the vacuum suction cup (4.4) along the Z-axis direction, detaching it from the wafer (6) and placing the wafer (6) on the support pins (1.4).

The ρ-direction linear driving device (2) moves the Z-direction lifting driving device (3) and the θ-direction rotary driving device (4) along the ρ-axis direction by a distance ρj, aligning the center (O) of the vacuum suction cup with the center (P) of the wafer. The Z-direction lifting driving device (3) moves the vacuum suction cup (4.4) along the Z-axis direction, lifting the wafer (6) from the support pins (1.4).

The ρ-direction linear driving device (2) moves the Z-direction lifting driving device (3) and the θ-direction rotary driving device (4) back to the original position along the ρ-axis direction. The Z-direction lifting driving device (3) moves the vacuum suction cup (4.4) along the Z-axis direction, detaching it from the wafer (6) and placing the wafer (6) on the support pins (1.4), completing the calibration of the wafer (6), with the center (P) of the wafer adjusted to the original position (I) of the wafer calibrator.

The optical calibration device calculates the position deviation of the wafer on the wafer calibrator using a calibration algorithm, which is fitted by the least squares method.

The sampled data of the rotation angle of the vacuum suction cup (4.4) during wafer rotation and the shading length Li between the emitter (5.2) and receiver (5.3) are [θi, Li]. The distance between the center (O) of the vacuum suction cup and the emitter (5.2) is L0. The sampling coordinates of the actual sampling points on the wafer edge relative to the polar coordinates (ρ, θ) of the vacuum suction cup (4.4) are (Li+L0, −θi), with the corresponding Cartesian coordinates being [(Li+L0)cos θi, −(Li+L0)sin θi].

In the process of moving, it is detached from the wafer (6) and the wafer (6) is placed on the support pin (1.4), the calibration of the wafer (6) is completed at this time, and the wafer center (P) is adjusted to the original position of the wafer calibrator (I.).

Optionally, the optical calibration device calculates the position deviation of the wafer on the wafer calibrator by using a calibration algorithm, and the calibration algorithm is fitted according to the least squares method as:

$$u_i = (L_0 + L_i)\cos(\theta_i) - \sum (L_0 + L_i)\cos(\theta_i)/N$$

$$v_i = -(L_0 + L_i)\sin(\theta_i) + \sum (L_0 + L_i)\sin(\theta_i)/N$$

$$x_c = \frac{\sum u_i^2 v_i \sum u_i v_i - \sum u_i^3 \sum v_i^2 - \sum u_i v_i^2 \sum v_i^2 + \sum v_i^3 \sum u_i v_i}{2\left[\left(\sum u_i v_i\right)^2 - \sum u_i^2 \sum v_i^2\right]} + \frac{\sum (L_0 + L_i)\cos(\theta_i)/N}$$

$$y_c = \frac{\sum v_i^2 u_i \sum u_i v_i - \sum v_i^3 \sum u_i^2 - \sum u_i^2 v_i \sum u_i^2 + \sum u_i^3 \sum u_i v_i}{2\left[\left(\sum u_i v_i\right)^2 - \sum u_i^2 \sum v_i^2\right]} - \frac{\sum (L_0 + L_i)\sin(\theta_i)/N}$$

$$\rho_j = \sqrt{x_c^2 + y_c^2}$$

$$\theta_j = \begin{cases} \arctan\left(\dfrac{x_c}{\rho_j}\right), & x_c \geq 0 \\ \arctan\left(\dfrac{x_c}{\rho_j}\right) + \pi, & x_c < 0 \end{cases}$$

The invention claimed is:

1. A wafer calibration method for a wafer calibration device including the steps of:
   a. providing a base frame (1) in the wafer calibration device;
   b. providing the base frame (1) with a posture adjustment mechanism and an optical calibration device (5) corresponding to the posture adjustment mechanism, wherein the posture adjustment mechanism is driven with a vacuum suction cup (44) for receiving a wafer (6);
   c. providing the optical calibration device (5) with an emitter (52) and a receiver (53) arranged on one side of the vacuum suction cup (44), and a detection area reserved between the emitter (52) and the receiver (53);
   d. the optical calibration device (5) detects the shading distance of the wafer (6) received by the vacuum suction cup (44) in the detection area relative to the optical calibration device (5);
   e. the posture adjustment mechanism drives the vacuum suction cup (44) to move the wafer (6) received by the vacuum suction cup (44) relative to the detection area back and forth and up and down;
   f. the posture adjustment mechanism includes a displacement mechanism arranged on the base frame (1), wherein the displacement mechanism includes a linear driving device (2) arranged on the base frame (1), and the linear driving device (2) is driven to be provided with a lifting driving device (3);
   g. the lifting trajectory of the lifting driving device (3) and the driving trajectory of the linear driving device (2) form a vertical coordinate system;
   h. the posture adjustment mechanism also includes a rotary driving device (4) driven to be arranged on the displacement mechanism;
   i. the rotary driving device (4) is arranged on the lifting driving device (3), and the rotary driving device (4) is driven to be provided with the vacuum suction cup (44);
   j. the posture adjustment mechanism also includes a plurality of support pins (14) arranged on the base frame (1), and the plurality of support pins (14) are distributed around the periphery of the vacuum suction cup (44);

k. the linear driving device (2) is installed on the base frame (1) through a base (11), wherein the linear driving device (2) includes a first screw rod (21); and the first screw rod (21) is axially horizontally placed, and both ends of the first screw rod (21) are respectively installed on the base (11) through a first bearing seat (22), a first motor (23) is drivingly connected to the first screw rod (21) through a coupling (25), and the first motor (23) is fixed on the base (11) through a first motor seat (26);

l. Providing a first nut seat (27) that is connected to a first transition connecting block (28), and the first transition connecting block (28) is fixed on a sliding seat, the sliding seat includes a lower connecting plate (210), and a right connecting plate (29) and a left connecting plate (211) are arranged at intervals on the lower connecting plate (210), the lower connecting plate (210) is slidably arranged on a first linear guide rail (24), the first linear guide rail (24) is arranged on the base (11), and the left connecting plate (211) and the right connecting plate (29) are fixedly connected through a connecting rib (212);

m. the lifting driving device (3) is arranged on the left connecting plate (211) and the right connecting plate (29);

n. the lifting driving device (3) includes a second screw rod (31), and the second screw rod (31) is axially vertically placed, and both ends of the second screw rod (31) are respectively arranged on the left connecting plate (211) through a second bearing seat (32);

o. a second motor (33) is installed on the right connecting plate (29) through a second motor seat (36) and a first connecting bent plate (37), the second motor (33) is drivingly connected with a first synchronous pulley (38), the second screw rod (31) is drivingly connected with a second synchronous pulley (39), the second synchronous pulley (39) is drivingly connected with the second motor (33) through a first synchronous belt (34), a second nut seat (310) is connected with a lifting platform (312) through a second transition connecting block (311), one side of the lifting platform (312) is drivingly installed on the left connecting plate (211) through a second linear guide rail (35), and the other side of the lifting platform (312) is slidably connected with a third linear guide rail (315) arranged on the right connecting plate (29) through a beam (313) and an auxiliary sliding plate (314);

p. the rotary driving device (4) is installed on the lifting platform (312);

q. the rotary driving device (4) includes a third motor (41), the third motor (41) is arranged on the lifting platform (312) through a third motor seat (45) and a second connecting bent plate (46), a support block (47) is fixed on the beam (313), a rolling bearing (48) is coaxially installed on the support block (47) and the beam (313), a rotating shaft (43) is drivingly connected to the rolling bearing (48), a third synchronous pulley (49) is drivingly connected to the rotating shaft (43), the third synchronous pulley (49) is drivingly connected with a fourth synchronous pulley (410) drivingly connected to the third motor (41) through a second synchronous belt (42), the rotating shaft (43) is a hollow shaft, a rotary joint (411) is installed at the lower end of the rotating shaft (43), and the vacuum suction cup (44) is fixedly installed at the upper end of the rotating shaft (43);

r. wherein the wafer calibration device wafer calibration method further includes the following steps:

i. Step S1, obtaining the wafer (6), the step includes: the vacuum suction cup (44) moves to the original position (I) to obtain the wafer (6);

ii. Step S2, detecting the posture of the wafer (6), the step includes: the posture adjustment mechanism drives the wafer (6) to move to the detection position, the optical calibration device (5) on one side of the posture adjustment mechanism detects the shading distance of the wafer (6) at the optical calibration device (5), and calculates the position deviation of the wafer (6) on the vacuum suction cup (44) of the wafer calibration device through a calibration algorithm;

iii. Step S3, calibrating the posture of the wafer (6), the step includes: the linear driving device (2) and the lifting driving device (3) of the posture adjustment mechanism drive the wafer (6) to move, and the rotary driving device (4) drives the wafer (6) to rotate;

iv. Step S4, calibrating the center (P) of the wafer; the step includes: transferring and adjusting the position of the wafer (6) between the support pins (14) and the vacuum suction cup (44), so that the center (O) of the vacuum suction cup coincides with the center (P) of the wafer;

v. Step S5, resetting the wafer (6) after calibrating the center (P) of the wafer; the step includes: placing the wafer (6) after calibrating the center (P) of the wafer on the support pins (14), and positioning the center (P) of the wafer at the original position (I); wherein the step of obtaining the wafer (6) by the vacuum suction cup (44) moving to the original position (I) further includes:

i. the wafer (6) is placed on the support pins (14), the first motor (23) of the linear driving device (2) drives the first nut seat (27) to move to the original position (I) along the linear direction of the ρ axis;

ii. the second motor (33) of the lifting driving device (3) drives the second screw rod (31) to rotate, the second screw rod (31) drives the second nut seat (310) to drive the lifting platform (312) to move the rotary driving device (4) along the lifting direction Z, and the vacuum suction cup (44) lifts the wafer (6) from the support pins (14) to the working height (III) during the movement process;

iii. the rotary joint (411) of the rotary driving device (4) is connected to the vacuum pump, the vacuum pump works, and a negative pressure is generated between the vacuum suction cup (44) and the wafer (6), using atmospheric pressure to adsorb the wafer (6) on the vacuum suction cup (44), thereby obtaining the wafer (6).

2. The wafer calibration method for a wafer calibration device according to claim 1, wherein:

the calibration algorithm is fitted by the least squares method, comprising the step of:

fitting the equation of the circle in which the actual sampling point of the wafer edge is located by the least squares method in a right-angle coordinate system:

$(X-x_c)^2 + (Y-y_c)^2 = R^2;$ the square of the distance from the sampling points (xi, yi) to the fitted circle is minimized by the square of the difference between the radius squared, let:

$f = \Sigma[(x_i-x_c)^2 + (y_i-y_c)^2 - R^2]^2;$ f is minimized, then:

$$\frac{\partial f}{\partial x_c} = 0;$$

$$\frac{\partial f}{\partial y_c} = 0;$$

$$\frac{\partial f}{\partial R} = 0;$$

Order:

$$u_i = (L_0 + L_i)\cos(\theta_i) - \Sigma(L_0 + L_i)\cos(\theta_i)/N;$$

$$v_i = -(L_0 + L_i)\sin(\theta_i) + \Sigma(L_0 + L_i)\sin(\theta_i)/N;$$

Get:

$$x_c = \frac{\sum u_i^2 v_i \sum u_i v_i - \sum u_i^3 \sum v_i^2 - \sum u_i v_i^2 \sum v_i^2 + \sum v_i^3 \sum u_i v_i}{2\left[\left(\sum u_i v_i\right)^2 - \sum u_i^2 \sum v_i^2\right]} + \sum (L_0 + L_i)\cos(\theta_i)/N;$$

$$y_c = \frac{\sum v_i^2 u_i \sum u_i v_i - \sum v_i^3 \sum u_i^2 - \sum u_i^2 v_i \sum u_i^2 + \sum u_i^3 \sum u_i v_i}{2\left[\left(\sum u_i v_i\right)^2 - \sum u_i^2 \sum v_i^2\right]} - \sum (L_0 + L_i)\sin(\theta_i)/N;$$

$$\rho_j = \sqrt{x_c^2 + y_c^2};$$

$$\theta_j = \begin{cases} \arccos\left(\frac{x_c}{\rho_j}\right), & y_c \geq 0 \\ 2\pi - \arccos\left(\frac{x_c}{\rho_j}\right), & y_c < 0 \end{cases};$$

wherein X, Y, and R are the horizontal and vertical coordinates of the circle where the fitted wafer edge is located and the radius of the circle, respectively, xc and yc are the horizontal and vertical coordinates of the center of the circle, Oi is the sampled value of the angle of the vacuum suction cup (44) during the rotation of the wafer (6) in the polar coordinates, Li is the sampled value of the shading length between the emitter (52) and the receiver (53) in the polar coordinates, N is the number of the sampling points, L0 is the distance between the center of the vacuum chuck circle (O) and the emitter (52), ρj,θj are the polar diameter and polar angle of the center of the wafer circle (P) in polar coordinates; ui and vi are the intermediate variables I and II used to simplify the arithmetic of xc and yc, respectively.

3. The wafer calibration method of a wafer calibration device according to claim 1, characterized in that:
the specific step of detecting the shade distance of said wafer (6) at the optical calibration device (5) comprises the substeps of:
the motor I (23) of the linear driving device (2) drives the filament mother holder I (27) in the linear direction p to move the circumference of the wafer (6) to the detecting position (II) between the emitter (52) and the receiver (53) of the optical calibration device (5), ensuring that the distance between the center of the vacuum suction cup (O) and the emitter (52) is L0;
the motor III (41) of the rotary drive unit (4) drives the wafer (6) on the vacuum chuck (44) to rotate along the rotation axis θ coaxial with the vacuum chuck (44); and
the angle of rotation θi of the motor III (41) and the shading length Li of the corresponding wafer (6) between the transmitter (52) and the receiver (53) at this time are recorded in real time.

4. The wafer calibration method of a wafer calibration device according to claim 1, characterized in that:
calculating, by means of a calibration algorithm, the positional deviation of said wafer (6) on said vacuum chuck (44) of the wafer calibration device comprises the additional substeps of:
calculating the polar (ρj,θj) positional deviation of the center of the wafer (6) in the polar (ρ,θ) coordinate system in which the vacuum chuck (44) is located using the sampling data [θi,Li] and the calibration algorithm;
said displacement of the wafer (6) and angular rotation of the wafer (6) comprises the following steps:
the slewing drive (4) drives the vacuum chuck (44) to rotate −θj angle along the θ-axis direction so that the center of the wafer (P) coincides with the ρ-axis in polar coordinates, the
transferring the position of the adjusted wafer (6) between the support pin (14) and the vacuum suction cup (44) includes the following steps:
the linear driving device (2) drives the lifting driving device (3) and the slewing driving device (4) to move from the detecting position to the original position (I);
the wafer (6) is detached from the vacuum suction cups (44) for adsorption, the lifting driving device (3) drives the vacuum suction cups (44) to move along the direction of the Z-axis, the vacuum suction cups (44) are detached from the wafer (6) during the moving process and the wafer (6) is placed on the supporting pin shaft (14), the linear drive device (2) drives the lifting drive device (3) and the slewing drive device (4) to move along the ρ-axis direction by a distance of pj; so that the center of the vacuum suction cup circle (O) coincides with the center of the wafer circle (P);
wherein the step of placing the wafer (6), which has been calibrated by the wafer circle center (P), onto the support pin (14) comprises the substeps of:
 (a) the lifting drive device (3) drives the vacuum suction cup (44) to move in the Z-axis direction to lift the wafer (6) from the support pin axis (14);
 (b) the linear drive device (2) drives the lifting drive device (3) and the slewing drive device (4) to the original position in the ρ-axis direction, and the lifting drive device (3) drives the vacuum suction cup (44) to move in the Z-axis direction, and the vacuum suction cup (44) is moved with the wafer (6) is detached, and the wafer (6) is placed on the support pin (14); and
 (c) the calibration of the wafer (6) is completed, and the wafer center (P) is adjusted to the original position (I).

\* \* \* \* \*